United States Patent [19]

Motoki et al.

[11] Patent Number: 5,462,771
[45] Date of Patent: Oct. 31, 1995

[54] METHOD OF MANUFACTURING ELECTROMAGNETIC WAVE SHIELDING PLASTIC MOLDING

[76] Inventors: Akira Motoki, 28-1, Takatsukadai 2-chome, Kawai-cho, Kitakatsuki-gun, Nara; Yoichi Murayama, 304 Domusu-mejiro, Shimoochiai 3-chome, Shinjuku-ku, Tokyo, both of Japan

[21] Appl. No.: 149,533

[22] Filed: Nov. 9, 1993

[30] Foreign Application Priority Data

| Nov. 9, 1992 | [JP] | Japan | 4-298940 |
| Nov. 26, 1992 | [JP] | Japan | 4-317380 |
| Feb. 18, 1993 | [JP] | Japan | 5-29215 |
| Feb. 18, 1993 | [JP] | Japan | 5-29216 |
| Feb. 18, 1993 | [JP] | Japan | 5-29217 |
| Sep. 7, 1993 | [JP] | Japan | 5-222638 |

[51] Int. Cl.$^6$ .................................................. C23C 4/00
[52] U.S. Cl. ............................ 427/537; 205/164; 205/186
[58] Field of Search ........................ 427/537, 564, 427/576; 205/164, 186

[56] References Cited

U.S. PATENT DOCUMENTS

| 4,544,571 | 10/1985 | Miller | 427/537 |
| 4,717,587 | 1/1988 | Suhr et al. | 427/576 |
| 4,990,363 | 2/1991 | Suhr et al. | 427/537 |

*Primary Examiner*—John Niebling
*Assistant Examiner*—Brendan Mee
*Attorney, Agent, or Firm*—Wenderoth, Lind & Ponack

[57] ABSTRACT

The present invention provides a method of manufacturing an electromagnetic wave shielding plastic molding, which comprises the step of, without prior washing and without providing a primer layer, or after providing a water-soluble primer layer, forming a conductive layer comprising at least one selected from the group consisting of Al, Cu, Ni, Cr and Sn and alloys thereof by high-frequency excited plasma. The electromagnetic wave shielding plastic molding thus-produced has excellent in electromagnetic wave shielding effects, adhering strength, humidity resistance and hardness, has economic advantages, and hence is useful as an electromagnetic wave shield for a plastic molding, such as the housing for a portable telephone.

19 Claims, 4 Drawing Sheets

METHOD OF MANUFACTURING ELECTROMAGNETIC WAVE SHIELDING PLASTIC MOLDING

FIELD OF THE INVENTION

The present invention relates to a method of manufacturing an electromagnetic wave shielding plastic molding, More particularly, the present invention relates to a method of manufacturing a high-performance electromagnetic wave shielding plastic molding which is excellent in the electromagnetic wave shielding effect of such devices as a communication equipment, a computer and a measuring instrument, is simple, and permits low-cost production.

PRIOR ART STATEMENT

Various electromagnetic wave shielding structures have conventionally been adopted for various electric and electronic devices and communications machines. As one of such structures, there is known a structure in which a thin film of copper, nickel, aluminum or the like is arranged on the surface of a plastic molding by the application of a conductive paint, electroless plating or vacuum film forming.

The conventional structures as described above include, film structures provided by:

1) application of a conductive paint;
2) vacuum deposition;
3) electroless plating;
4) one-side electroless plating.

These conventional electromagnetic wave shielding plastic moldings are not, however, in a sufficiently satisfactory state, irrespective of the method and the structure, and pose many problems.

The application of a conductive paint listed in 1) above, though available at a low cost, gives only a low shielding effect: particularly at a frequency of at least 500 MHz, the effect is rapidly reduced. With electroless plating given in 3) above, a relatively satisfactory shielding effect is available, but the face painting on the outer surface, which cannot be omitted, leads to a high cost. One-side electroless plating mentioned in 4) above is defective in that it requires a very complicated process and a very high cost.

A film formed by 2) vacuum deposition has features as gas-phase-formed film so that development hereafter is expected. However, now that there is a tendency toward a smaller size and a higher density for electric circuits, it is believed to be necessary to form a film of aluminum or the like having a thickness of from 5 to 10 μm in order to obtain shielding properties similar to that made by electroless plating.

In the shielding structure available by this vacuum deposition, however, a film thickness of 5 μm or over results in considerable growth of columnar structure, and in spite of the actual necessity of a pencil hardness of at least 2H, it is very difficult to achieve a strength on this level.

This film cannot withstand an environmental reliability test such as a moisture resistance test (65° C. 95% RH, 168 hours) and a moisture resistance water spray test (in accordance with JIS (Japanese Industrial Standards) Z2371; 5% NaCl solution, 35° C., spray for eight hours, and stoppage for 16 hours; repeating this cycle four times), and the rating in an adhesion test (ASTM D3559-78) is lower than Class 3.

In addition, an aluminum vacuum-deposited film is defective in that an oxide film (passivated layer) is formed in the open air, and this insulating film makes conduction insufficient at the contact point with other metals, which are necessary for shielding. Furthermore, when exposed continuously to an environment having a high water content, the conventional aluminum vacuum-deposited film may suffer corrosion accelerated due to a battery effect, if in contact with another metal such as copper or nickel, as typically represented by MIL-F-15072 (EL) 1969K.

Apart from aluminum, conceivable vapor materials for vacuum deposition include, when considering the shielding properties, gold, silver, copper, nickel and chromium. However, gold and silver are too expensive to be practicable.

Copper, on the other hand, being excellent in conductivity and practicable in terms of cost, is seriously oxidized when subjected to a high-temperature and high-humidity environment test, thus rapidly losing its shielding effect. Because copper does not form an oxide film as a passivation layer like aluminum, serious oxidation corrosion takes place.

A conceivable measure to prevent oxidation of copper is to coat it with nickel (Ni), gold (Au), silver (Ag), or chromium (Cr). When actually forming a film on a copper film by vacuum deposition, however, application of a humidity resistance test (60° C.×95%×240 hrs.) reveals a low adhesion, thus showing non-practicability, although initial adhesion is satisfactory.

Application of an electromagnetic shield is now becoming more popular, along with efforts to produce a lighter weight molding having a thinner wall thickness. With such reduction of thickness, the film is required to be excellent in strength, thermal shock resistance and flexibility. Conventional films do not provide sufficient strength and flexibility.

SUMMARY OF THE INVENTION

The present invention was developed in view of the circumstances as described above, and has an object to provide a method of manufacturing an electromagnetic wave shielding plastic in molding, which solves the defects in the conventional electromagnetic wave shielding structures, excellent in adhesion, durability, water resistance and other properties, even in the shielding structure, while displaying favorable features of a gas-phase-formed film, permits reduction of thickness and allows a high productivity.

More particularly, the present invention provides, for solving the above-mentioned problems, the following manufacturing methods:

1) A method of manufacturing an electromagnetic wave shielding plastic molding, which comprises the step of providing a conductive layer comprising at least a metal selected from the group consisting of Al, Cu, Ni, Cr and Sn or an alloy thereof, by high-frequency excited plasma on the surface of a plastic molding without previously washing and without providing a primer coat layer.

2) A method of manufacturing an electromagnetic wave shielding plastic molding, which comprises the step of providing a multi-layer film with any of the above-mentioned metals or an alloy thereof.

3) A method of manufacturing an electromagnetic wave shielding plastic molding, which comprises the steps of bombard-treating the surface of a plastic molding with high-frequency plasma without previously washing and without providing a primer coat layer, and then, providing a single layer or a multi-layer film of any of said metals or an alloy thereof.

Furthermore, the present invention provides a manufacturing method, using a water-soluble primer, having the following features:

4) A method of manufacturing an electromagnetic wave shielding plastic molding, which comprises the steps of providing a primer coat layer comprising a water-soluble paint on the surface of a plastic molding containing a filler, and after drying same, providing a conductive layer comprising at least one metal selected from the group consisting of Al, Cu, Ni, Cr and Sn or an alloy thereof by high-frequency excited plasma in a vacuum chamber.

The present invention also provides a more practical method to resolve problems which occur as a result of adhesion of a sliding oil, used for injection molding, to the surface of plastic molding.

5) A method of manufacturing an electromagnetic wave shielding plastic molding, which comprises the step of previously washing parts of the surface of a plastic molding, which are contacted by molding pins or sliding cores having a sliding-oil at the surface thereof, using an organic solvent, followed by bombard-treating the surface of plastic molding with a high-frequency plasma, and then providing a conductive layer by high-frequency excited plasma on the surface of a plastic molding.

There is thus provided an electromagnetic wave shielding plastic molding which is excellent, in electromagnetic wave shielding effects, while displaying the favorable features of gas-phase vacuum deposition, permits savings in resources is high in adhesion, has satisfactory corrosion, water and heat shock resistance, and which is excellent in strength, as well as in flexibility.

DETAILED DESCRIPTION OF THE INVENTION

Figure 1:
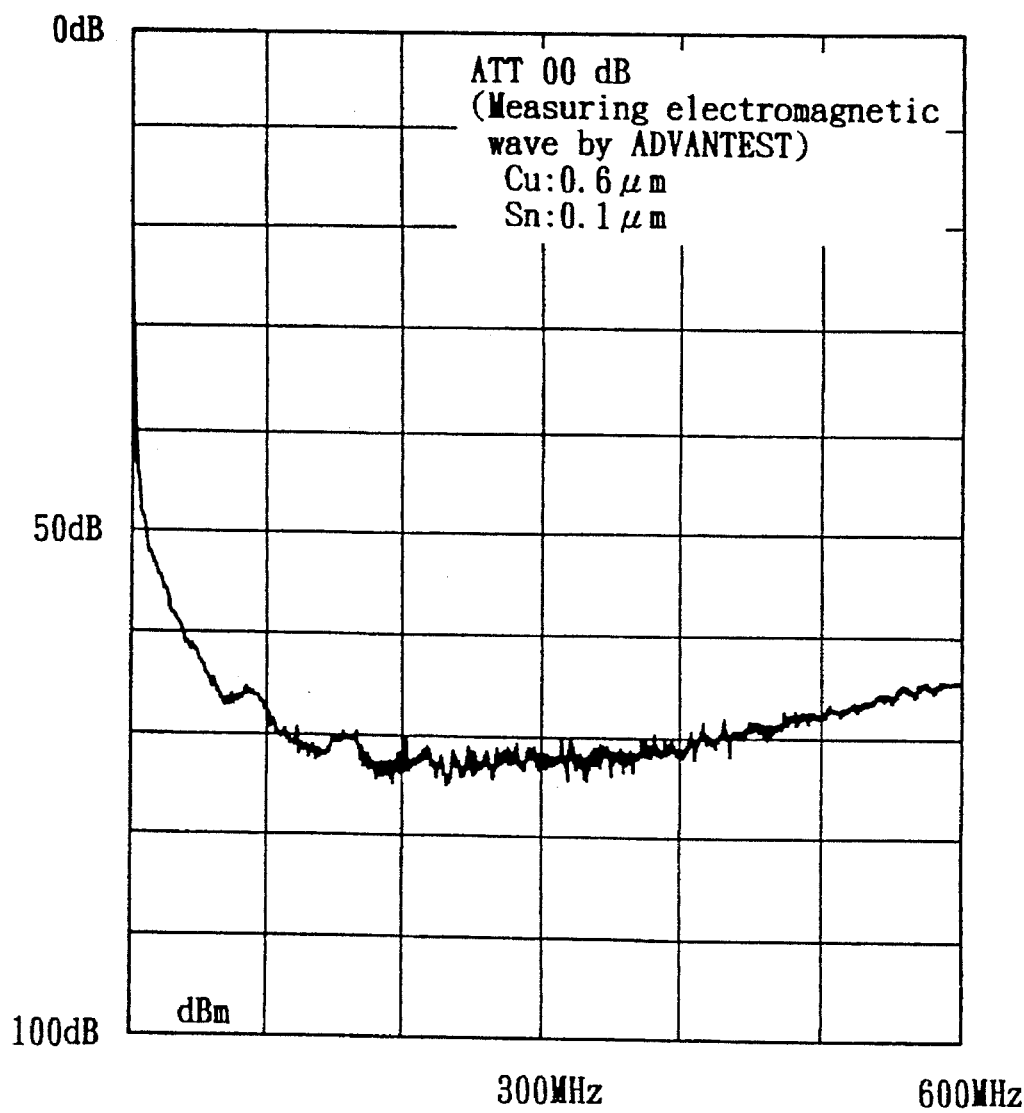
FIG. 1 is a graph illustrating the results of measurements of electromagnetic wave in an advance test, of a Cu—Sn laminated film on an ABS (Acrylonitrile-Butadiene-Styrene Copolymer) sheet of the present invention.

The electromagnetic wave shielding plastic moldings of the present invention include various plastic moldings molded by injection molding, extrusion molding, and casing and surface-formed moldings, and the thickness of the single-layer or multi-layer film of any of Al, Cu, Ni, Cr and Sn or an alloy thereof to be provided on the surface is appropriately selected, depending upon the particular purpose and use.

A film thickness of 0.7 μm suffices for a molding for a 16-bit lap-top personal computer, and this thickness may be 3 μm or larger for a 32-bit personal computer.

In the present invention, it is not necessary to wash the plastic molding in advance as in a conventional one. Mold oil such as a sliding lubricant deposited on the molding can be easily be washed off by a surface bombardment effect using high-frequency excited plasma. It is not at all necessary to depend on FREON or its alternative to avoid zone breakage.

In addition, except for restrictions unique to individual kinds of plastics, it is not usually necessary in the present invention to provide a primer coat layer on the surface of the plastic molding, which has conventionally been believed to be essential, prior to vacuum deposition. The primer coat layer has been indispensable for improving the adhesion between a plastic molding surface and an aluminum film. For the electromagnetic wave shielding plastic molding of the present invention, however, the metal or the alloy thereof has a sufficient adhesion under the bombardment surface roughing effect brought about by high-frequency excited plasma and the activation accumulation effect caused by excited ion seed. Even for a thickness of over 3 μm, it is not necessary to provide a primer coat layer.

Film forming by high-frequency plasma is accomplished, for example, in a vacuum chamber having a degree of vacuum on a level of $1\times10^{-4}$ to $1\times10^{-5}$ Torr, by plasma excitation through introduction of an inert gas such as argon under a partial pressure of about $1\times10^{-4}$ to $1\times10^{-3}$ Torr produced by the application of voltage from a high frequency source. This is a low-pressure glow discharge plasma. The film forming material such as Al, Cu, Ni, Cr or Sn may be evaporated by an appropriate means such as resistance heating, induction heating, irradiation of electron beam, or holo-cathode discharge. These vapor particles are high-frequency excited, ionized and deposited onto the surface of the plastic molding to form a film.

This high-frequency excited plasma may appropriately be implemented with reference to the knowledge of the conventionally known art.

Film forming is possible either by a batch method or by continuous method. Since recovery is easy, it may be reused.

Examples of film forming are as follows:

(1) An Al film, formed by high-frequency excited plasma, having a film thickness of from 0.7 to 5.0 μm;

(2) Al and Cu films, formed by high-frequency excited plasma, having a thickness of from 0.7 to 5.0 μm;

(3) A Cu film, formed by high-frequency excited plasma, having a thickness of from 0.7 to 5.0 μm, followed by an Sn film, formed by high-frequency excited plasma, having a thickness of from 0.5 to 2.0 μm;

(4) A Cu film, formed by high-frequency excited plasma, having a thickness of from 0.7 to 5.0 μm, followed by an Ni—Cr (50 to 80 wt.% Ni and 50 to 20 wt. % Cr) film, formed by high-frequency excited plasma, having a thickness of from 0.05 to 2.0 μm.

For the nickel-chromium film shown in (4) above, the presence of chromium (Cr) at a prescribed ratio as described above is essential. Film forming should be accomplished by high-frequency excited plasma without fail.

When using the method based on high-frequency excited plasma, the copper surface is activated by plasma and adhesion with the nickel-chromium film is largely improved, thus permitting an increase in adhesion. When a film is formed with nickel alone without using chromium, not only is peeloff easily caused on the interface with copper, but also a yellowish coloration takes place on the surface of nickel itself after the environmental test, and occurrence of rust is inevitable. The risk of this coloration is eliminated in the present invention.

It is needless to mention that such a high-frequency excited plasma can be appropriately implemented with reference to the knowledge of known technologies.

In addition to (1) to (4) above, the present invention provides the following embodiments:

(5) A Cu film formed by high-frequency plasma, having a thickness of from 0.7 to 5.0 μm, followed by a metal or alloy film, formed by high-frequency plasma, having a thickness of from 0.05 to 2.0 μm, in an organic gas atmosphere;

(6) A Cu film formed by high-frequency plasma, having a thickness of from 0.7 to 5.0 μm, followed by a conductive oxide film, formed by high-frequency plasma, having a thickness of from 0.05 to 2.0 μm;

(7) A Cu film formed by high-frequency plasma, having a thickness of from 0.7 to 5.0 μm, followed by a Cu electrolytic plating film having a thickness of from 10 to 30 μm.

Also in these embodiments, it is possible to manufacture an electromagnetic wave shielding plastic molding excellent in adhesion, hardness, electromagnetic wave shielding effect and productivity.

In the above-mentioned embodiment (5) in which the metal or alloy film is formed in an organic gas, the metal or alloy film having a thickness of from 0.05 to 2.0 μm is vapor-deposited in an organic gas atmosphere, following formation of the copper film, similar to high-frequency excited plasma. In this case, substantially the same conditions as above may be adopted.

Metals and alloys to be vapor-deposited include such metals as Au, Ag, Ni, Cr, W, Zr, Sn and Co and alloys thereof. High-frequency excited vapor deposition of these metals or alloys is accomplished in an organic gas atmosphere. The gas for this atmosphere is appropriately selected from saturated or unsaturated hydrocarbons such as methane, ethane, ethylene, and propylene, and such substitution compounds as hydroxy, alkoxy and carbonyls thereof.

By using any of these organic gases, the metal or alloy and the organic gas form a structurally complicated mixed film, thus remarkably improving the corrosion resistance and heat shock resistance.

The organic gas component may be introduced usually under a partial pressure of about $1 \times 10^{-4}$ to $1 \times 10^{-2}$ Torr. The ratio of this component may be selected in accordance with the content of the metal or the alloy.

In the conventional films, the film of nickel or the like on the copper film is peeled off in the environmental test. In the case of a film formed by the high-frequency excited plasma procedure of the present invention, the copper surface is activated by plasma, leading to a remarkable improvement in adhesion and an increase in adhering strength. In the present invention, furthermore, corrosion resistance in salt water spray and sulfur dioxide gas is also improved. Thus, a film highly resistant to thermal shock is available. The film has satisfactory strength and flexibility.

Also when forming a multi-layer film of a conductive oxide as presented in (6) above, a conductive oxide film having a thickness of from 0.05 to 2.0 μm is vapor-deposited, following formation of the copper film, similarly by high-frequency excited plasma. Also in this case, substantially the same conditions as mentioned above may be adopted.

Conductive oxides used in the film typically include tin oxide $SnO_2$ and indium-tin oxide (ITO). Together with argon or the like, a reactive gas such as oxygen gas may be introduced into the vacuum reaction chamber.

When using the high-frequency excited plasma method, the copper surface is activated by plasma, resulting in considerable improvement of adhesion with the conductive oxide and an increase in adhering strength. Furthermore, uniformity of the film on the copper surface is ensured, with a satisfactory deposition of the conductive oxide, and excellent protection of the copper surface is possible.

The embodiment (7) of the present invention is different from the other embodiments in that a Cu electrolytic plating is applied together with Cu film forming by high-frequency plasma. In this case also, an electromagnetic wave shielding plastic molding of a good quality is obtained.

More specifically, a copper film having a thickness of from 10 to 30 μm is provided by the application of electrolytic plating on the copper (Cu) film formed by plasma vapor deposition. A thick film is easily available by this electrolytic plating.

It is impossible in this case to apply electrolytic plating directly onto the plastic object, and even when applying chemical plating, improvement of adhesion cannot be expected.

For electrolytic plating, any of the conventionally known methods may be adopted.

In addition, a protection film of Ni (nickel) or the like for rust prevention of copper may be provided on the electrolytic plating film. From the point of view of durability, this protection film is desirable. The film may be formed either by electrolytic plating or by gas-phase vapor deposition.

The above-mentioned methods of manufacturing electromagnetic wave shielding plastic moldings do not require provision of a primer, however, a primer treatment may be effective, depending upon the kind of plastic material composing the plastic molding. In this case also, a unique treatment should be applied with a view to making full use of the features of the conductive film formed by high-frequency plasma.

More particularly, there is a tendency toward a further down-sizing of for plastic moldings such as electronic equipment housing, and a filler, such as glass fiber or carbon fiber is mixed in many cases, together with a forming material such as polycarbonate or polycarbonate ABS alloy resin for the purpose of improving the strength of moldings.

In the case of a plastic molding containing such a filler, even when the film is formed by high-frequency excited plasma, peeloff of the metal film has conventionally been unavoidable because of the occurrence of a partial surface layer peeloff under the effects of the surface toughened by the exposure of the filler on the surface of the molding itself.

For the purpose of improving the formability when a filler is incorporated, a large amount of a metal soap, such as zinc stearate, is contained as compared with an ordinary forming material to achieve a better forming fluidity of the resin. This component displaces (bleeds out) onto the molding surface, thus easily causing peeloff between the metal film and the molding surface.

The inner wall of the housing for an electronic equipment is more complicated in shape than the outer wall, and may therefore cause defective adhesion as a result of the deposition of a sliding lubricant from the extrusion pins or oblique pins of tile mold, impregnation of the surface layer portion of the molding, or deposition of cold slag near the gate.

Under these circumstances, when forming a high-performance shielding film by high-frequency excited plasma having excellent features as a film forming method, it is desirable to provide a primer coat, as a preliminary treatment, on the plastic surface.

On the other hand, however, the inner wall of the plastic housing of an electronic equipment, for example, has a complicated shape because of an insert fitting for securing a printed circuit board and other electronic components, an undercut shape and a rib, which results in a considerable forming strain. When a primer coat is provided, therefore, an organic solvent contained in the primer coat may cause cracks, or the drop ball impact (copper ball drop test) properties may be reduced considerably as compared with one not provided with a primer cost.

In order to solve these defects caused by the organic solvent, it is conceivable to use a water-soluble primer. A water-soluble primer, if water is not sufficiently removed, the water resistance and thin film properties is degraded. Unlike a metal substrate, actually, it is difficult to dry a plastic molding at a high temperature and to ensure sufficient removal of water, so that adoption of a water-soluble primer coat has been difficult.

In view the circumstances described above, the present invention provides an electromagnetic wave shielding plastic molding manufactured by providing a primer coat layer comprising a water-soluble paint having a thickness of from 1 to 30 μm on the surface of a plastic molding, and after low-temperature drying at a temperature of up to 100° C., providing an aluminum film having a thickness of from 0.6 to 5.0 μm by high-frequency excited plasma in a vacuum chamber. This method provides novel electromagnetic shielding plastic molding which solves the defects in the conventional electromagnetic wave shield, is excellent in such properties as adhesion, durability, water resistance, corrosion resistance and thermal shock resistance while displaying features of gas-phase film forming. This method also permits high productivity, and the achievement of excellent thin film properties, even for a plastic molding containing a filler.

The present invention also provides an electromagnetic wave shielding plastic molding manufactured by providing a primer coat layer, comprising a water-soluble paint, having a thickness of from 1 to 30 μm on the surface of a plastic molding, and after low-temperature drying at a temperature of up to 100° C., providing a copper film having a thickness of from 0.7 to 5.0 μm by a high-frequency excited plasma in a vacuum chamber, and furthermore, providing a corrosion-resistant metal or alloy film having a thickness of from 0.05 to 3.0 μm.

These electromagnetic wave shielding plastic moldings of course include various plastic moldings available by injection molding, extrusion molding and casting and moldings surface-formed therefrom. These moldings may contain a filler such as glass fiber or carbon fiber, depending upon the purpose and the use.

A water-soluble paint conventionally used as a primer coat is dried at a high temperature (higher than 150° C., for example) for a metal substrate, such as iron plate or an aluminum die cast, thus ensuring sufficient hardening of the paint. It is not therefore adversely affected by moisture. For a plastic housing, however, it is difficult to apply high-temperature drying as described above, and as a result, the moisture present in the primer coat is exposed in vacuum during the vapor deposition, thus tending to cause defective adhesion.

This inconvenience does not however occur when forming a film by high-frequency excited plasma in a vacuum after low-temperature drying at a temperature of up to 100° C.

This is considered to be attributable to the fact that the surface bombardment effect by high-frequency excited plasma performs an unexpected excellent function and achieves an excellent adhesion.

Examples of the water-soluble paint typically include acrylic emulsion paints, but the paint is not limited to them. The primer coat comprising this water-soluble paint should preferably have a thickness of from 1 to 30 μm, and the low-temperature drying should be carried out at a temperature of up to 100° C., or more preferably, of from 60° to 85° C., for a period of from several tens of minutes to four hours.

A film having a thickness of under 1 μm or over 30 μm would lead to a poorer adhering strength.

Unlike the primer coat using an organic solvent, this water-soluble paint never causes air pollution, so that its use is significant for environmental considerations.

Film forming by high-frequency excited plasma can be accomplished, as in the above-mentioned embodiments, by plasma excitation caused by the introduction of an inert gas such as argon or helium under a partial pressure of about $1\times10^{-4}$ to $1\times10^{-3}$ by the application of voltage from a high-frequency power source in a vacuum tank having a degree of vacuum of, for example, from $1\times10^{-4}$ to $1\times10^{-5}$ Torr. This is a plasma known as RF low-voltage glow discharge plasma. Aluminum and copper as film forming materials and a corrosion-resistant metal or alloy may be vaporized by an appropriate means such as resistance heating, induction heating, irradiation of electron beam, or holo-cathode discharge. These vapor particles are ionized by high-frequency excitation and deposited onto the surface of a plastic molding or the like to from a film.

Applicable corrosion-resistant metals or alloys to be vapor-deposited include such various metals as Au, Ag, Ni, Cr, W, Zr, Sn, and Co and alloys thereof. High-frequency excited vapor deposition of these metals and alloys is carried out, as in the above-mentioned embodiment (5), in an organic gas atmosphere. The gas is appropriately selected and used from saturated and non-saturated hydrocarbons such as methane, ethane and propylene and substituted compounds thereof such as hydroxy, alkoxy and carbonyl compounds.

Under the effect of the organic gas, the metal or the alloy and the organic gas compound form a structurally very complicated mixed film which remarkably improves corrosion resistance and heat shock resistance.

The organic gas component may be introduced usually at a partial pressure of about $1\times10^{-4}$ to $1\times10^{-2}$ Torr. The ratio of the organic gas component may be selected in response to the content of the metal or the alloy.

While in the environmental methods, as described above, the film of nickel or the like on the copper film was peeled off in an environment test, for the film formed with high-frequency excited plasma of the present invention, the copper surface is-activated by plasma, remarkably improving adhesion and leading to a higher adhering strength. In the present invention, furthermore, the corrosion resistance is remarkably improved in salt water spray and in a sulfur dioxide gas. A film resistant to thermal shock is also provided which has satisfactory strength and flexibility.

The thickness of the aluminum film should be within range of from 0.6 to 5.0 μm from the point of view of electromagnetic shielding effects, and the copper film should have a thickness of from 0.7 to 5.0 μm. The corrosion-resistant metal or alloy film should have a thickness within a range of from 0.05 to 3.0 μm.

It is needless to mention that the high-frequency excited plasma of the present invention may be appropriately conducted with reference to the known technologies.

Concerning to the plastic molding, these is a case of in which a sliding oil adheres to the surface thereof by injecting molding.

In this case, previously washing treatment as following, before bombard-treatment is more effective.

The washing treatment is comprised by washing parts of the surface, which are contacted by mold pins and sliding cores adhering a sliding oil at the surface thereof, using an organic solvent or organic solvents.

A organic solvent having a low boiling point or a mixture of organic solvents thereof is preferably used as the washing agent.

More particularly, acetone, methanol, ethanol, n-hexane, and diethylether is preferably used.

Now, the present invention will be described further in detail by means of examples.

EXAMPLE 1

An aluminum film was formed directly by high-frequency excited plasma without FREON washing and without forming a primer coat layer, on a housing for an automotive moving telephone formed from an ABS-PC alloy material as a plastic injection molding.

In a vacuum of $8 \times 10^{-5}$ Torr in a vacuum chamber, argon was introduced under a partial pressure of $3 \times 10^{-4}$ Torr, and excitation of aluminum vapor particles and deposition thereof onto the surface of the plastic injection mold was accomplished with glow plasma generated by coil-shaped high-frequency excitation electrodes. A film was formed until an aluminum film thickness of 3 μm was reached on the flat portion.

The electromagnetic wave shielding effect of the thus obtained electromagnetic wave shielding plastic molding was confirmed, through an advance test, to be equivalent to that obtained with an electroless plated 4 μm-thick one. The film properties were excellent as shown in Table 1.

TABLE 1

| Test item | Test method | Evaluation |
|---|---|---|
| Adhesion test | conformity to ASTMD 3359-78 | Class 5 B |
| Humidity resistance | 65° C. × 95% RH × 240 hr | Adhesion class 5 B Resistance value 7.0 mm Ω |
| | (No change between before and after the test) | |
| Pencil hardness | Japan Industrial Standard K5401 | 3 H |
| Salt spray test | Japan Industrial Standard Z2371 | Adhesion class 5 B |
| | 5% NaCl atmosphere 35° C. Sample angle: 45°, Spray for 8 hrs. stoppage for 16 hrs., Repeating six such cycles | Resistance value 7.0 mm Ω |
| | (No clange between before and after the test) | |

EXAMPLE 2

An injection molding sample comprising a BS resin having dimensions of 200×300 mm with a thickness of 3 mm was subjected to a plasma bombardment directly for two minutes in a vacuum chamber without FREON washing and without providing a primer coat layer, and then a 4 μm-thick aluminum film was formed by a high-frequency excited plasma.

In this Example, aluminum was vaporized by an electron beam. The reached degree of vacuum was $5 \times 10^{-5}$ Torr, and the argon partial pressure was $4 \times 10^{-4}$ Torr.

As in the Example 1, an electromagnetic shielding plastic molding having excellent properties was obtained.

EXAMPLE 3

Under the same conditions as in the Example 1, a 1 μm-thick copper film was first formed, and then a 2 μm-thick aluminum film was formed.

The thus obtained product showed excellent properties. The results of property tests are shown in Table 2.

TABLE 2

| Test item | Test method | Evaluation |
|---|---|---|
| Adhesion test | conformity to ASTMD 3359-78 | Class 5 B |
| Humidity resistance | 65° C. × 95% RH × 240 hr | Adhesion class 5 B Resistance value 6.8 mm Ω |
| | (No change between before and after the test) | |
| Pencil hardness | Japan Industrial Standard K5401 | 3 H |
| Salt spray test | Japan Industrial Standard Z2371 | Adhesion class 5 B |
| | 5% NaCl atmosphere 35° C. Sample angle: 45°, Spray for 8 hrs. stoppage for 16 hrs., Repeating six such cycles | Resistance value 6.8 mm Ω |
| | (No change between before and after the test) | |

There was achieved an electromagnetic shielding plastic molding which is excellent in electromagnetic shielding effect, and permits effective forming of an aluminum film thicker than 3 μm and further aluminum and copper films, without the necessity of FREON washing, or of providing a primer coat layer and eliminates the risk of contamination by waste liquid or waste gases.

COMPARATIVE EXAMPLE 1

Under the same conditions as in the Example 1, the film was formed by vacuum deposition in place of that by high-frequency excited plasma.

With an aluminum film thickness of 5 μm, the results of an advance test reveal that the electromagnetic shielding effect is far lower than in the Example 1, and the film properties is very low as typically represented by the adhesion test class 2, with a humidity resistance of Class 2 and a pencil hardness of only 1H.

COMPARATIVE EXAMPLE 2 tinder the same conditions as in the Example 1, the film was formed by direct current (DC) discharge plasma in place of that by high-frequency excited plasma.

With an aluminum film thickness of 3 μm, the electromagnetic shielding effect is inferior to that in the Example 1, with both adhesion and humidity resistance on the level of Class 3, and a pencil hardness of 2H, and the results of salt spray test was Class 3.

COMPARATIVE EXAMPLE 3

Under the same conditions as in the Example 1, the film was formed through vacuum deposition while irradiating electron beam.

No improvement in properties was yet observed.

EXAMPLE 4

A copper film and a tin film were formed directly by high-frequency excited plasma on a 1.50×150×3.0 mm ABS sheet, without FREON washing and without providing a primer coat layer.

More particularly, in the same vacuum chamber having a reached degree of vacuum of $3\times10^{-5}$ Torr, argon was introduced at a partial pressure of $1\times10^{-3}$ Torr, and the ABS sheet was left for ten minutes in glow plasma generated by coil-shaped high-frequency excitation (13.56 MHz) electrodes for bombardment. Then immediately, a 0.6 μm-thick copper film was formed under $1\times10^{-4}$ Torr.

Then, plasma was held for two minutes, and immediately, a 0.1 μm-thick tin film was formed under $1.5\times10^{-4}$ Torr.

The thus obtained electromagnetic wave shielding plastic molding showed excellent properties as shown in Table 3.

TABLE 3

| Test item | Test method | Evaluation |
|---|---|---|
| Adhesion test | conformity to ASTMD 3359-78 | Class 5 B |
| Humidity resistance | 65° C. × 95% RH × 240 hr | Adhesion class 5 B Resistance value 5.5 mm Ω (No change between before and after the test) |
| Pencil hardness | Japan Industrial Standard K5401 | 3 H |
| Salt spray test | Japan Industrial Standard Z2371 5% NaCl, atmosphere 35° C. Sample angle: 45°, Spray for 8 hrs. stoppage for 16 hrs., Repeating six such cycles | Adhesion class 5 B Resistance value 6.0 mm Ω (No change between before and after the test) |

Figure 3:
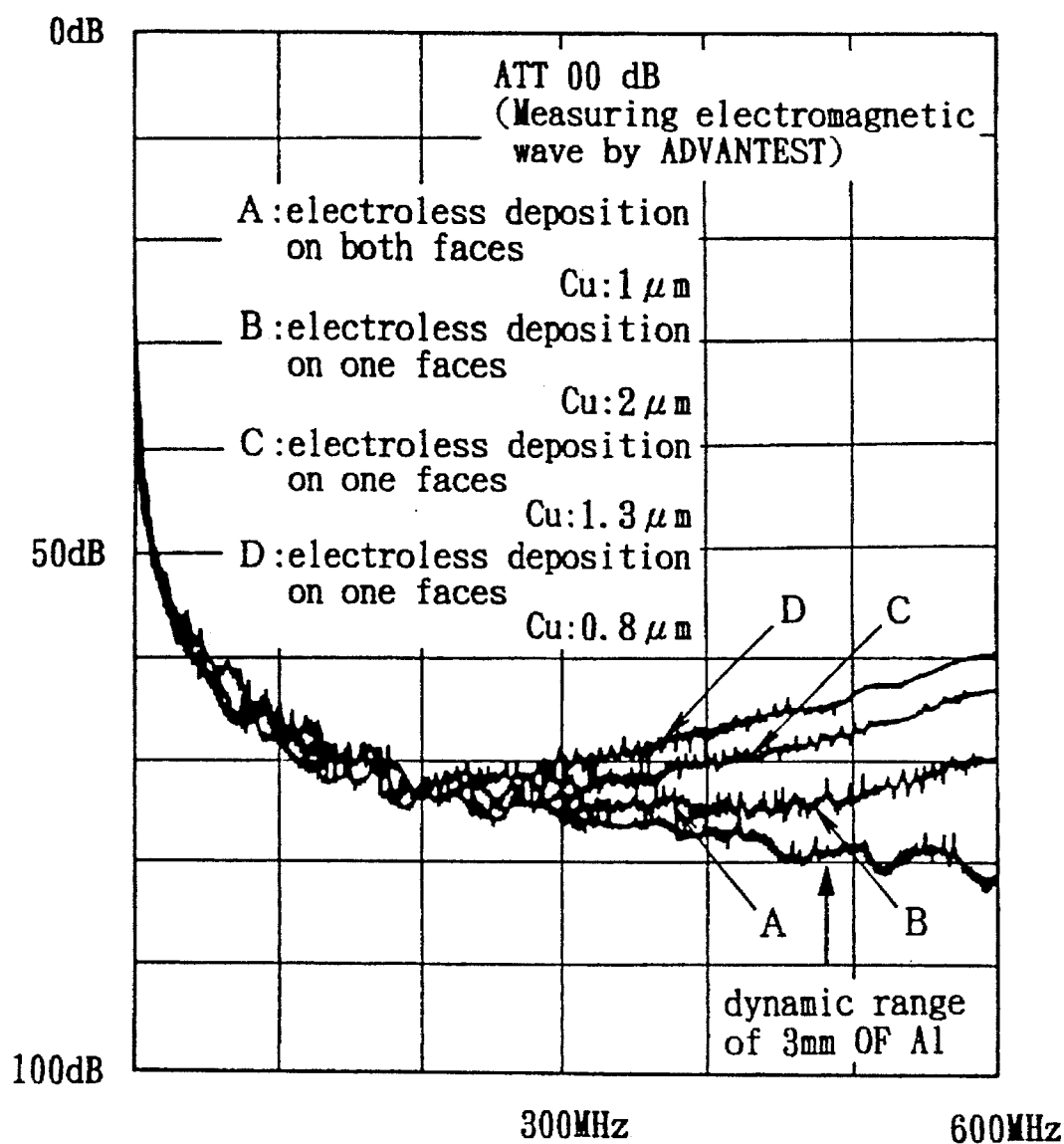
FIG. 3 is a graph illustrating the results of measurements of electromagnetic waves in an advance test, of a Cu-plating film for comparison.

FIG. 1 illustrates the results of measurement of electromagnetic waves in the advance test. As is clear from these results, a shielding effect similar to that obtained with an electroless plating (Cu) film having a thickness of 1.3 μm as shown in FIG. 3 is observed. In this Example, even a thin thickness as 0.6 μm for Cu and 0.1 μm for Sn gives a satisfactory effect, thus contributing to a saving of resources.

EXAMPLE 5

A film was formed by high-frequency excited plasma (13.56 MHz) directly in a vacuum chamber on a 150×150 mm and 3 mm-thick injection molding sample comprising ABS/PC (50/50) resin, without conducting FREON washing and without providing a primer coat layer.

With a reached degree of vacuum of $3\times10^{-5}$ Torr, argon was introduced to give $1\times10^{-3}$ Torr.

Plasma was held for ten minutes, and immediately a film was formed under $1\times10^{-4}$ Torr to a thickness of 0.1 μm. Then after holding plasma for two minutes, a 0.2 tin film was formed under $1.5\times10^{-4}$ Torr.

In the same manner as in the Example 4, an electromagnetic wave shielding plastic molding having excellent properties was obtained.

Figure 2:
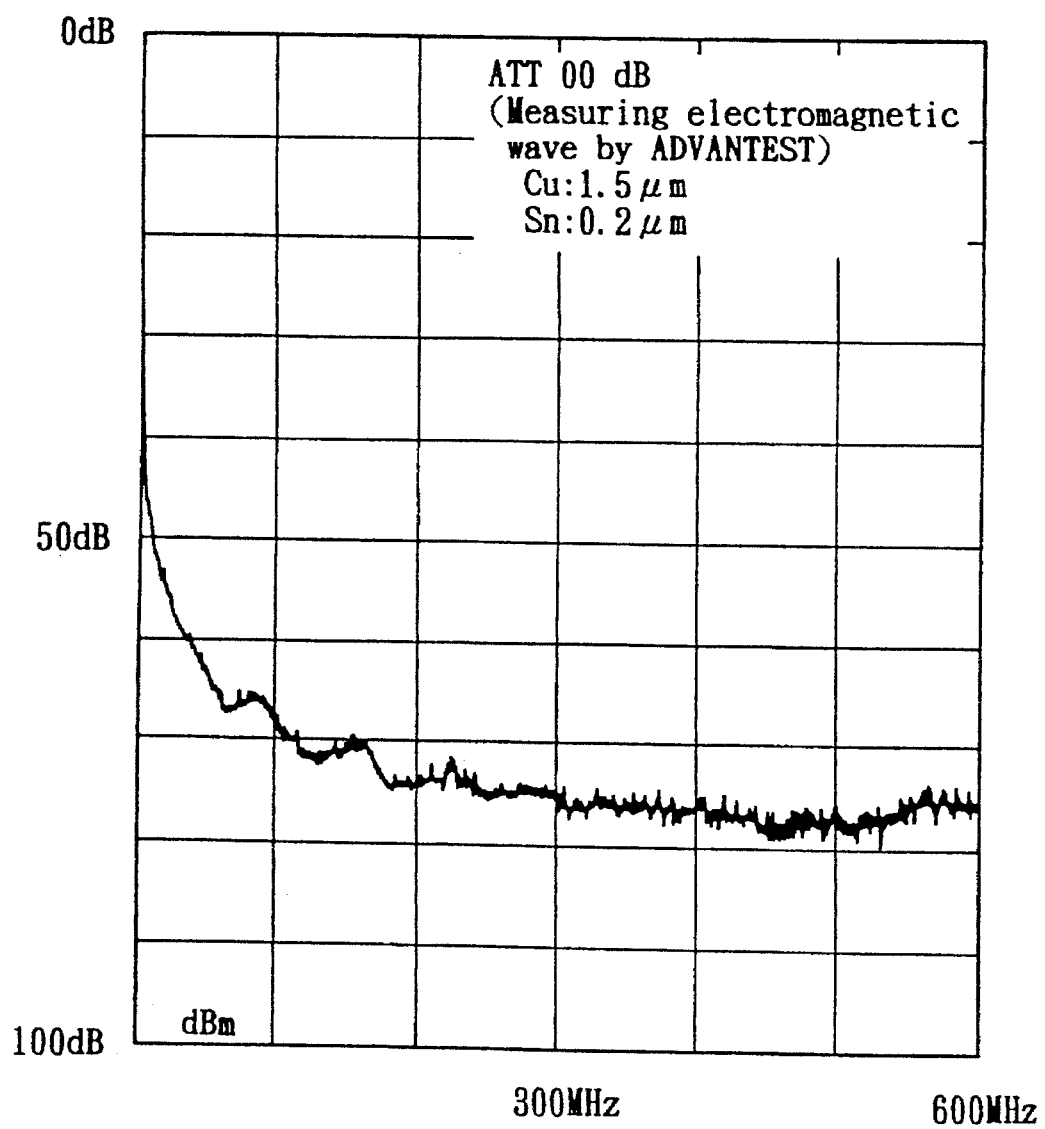
FIG. 2 is a graph illustrating the results of measurements of electromagnetic waves, in an advance test, of a Cu—Sn laminated film on an ABS/PC (polycarbonate) sample.

The properties are shown in Table 4 and FIG. 2.

TABLE 4

| Test item | Test method | Evaluation |
|---|---|---|
| Adhesion test | conformity to ASTMD 3359-78 | Class 5 B |
| Humidity resistance | 65° C.× 95% RH × 240 hr | Adhesion class 5 B Resistance value 5.7 mm Ω (No change between before and after the test) |
| Pencil hardness | Japan Industrial Standard K5401 | 3 H |

TABLE 4-continued

| Test item | Test method | Evaluation |
|---|---|---|
| Salt spray test | Japan Industrial Standard Z2371 5% NaCl, atmosphere 35° C. Sample angle: 45°, Spray for 8 hrs. stoppage for 16 hrs., Repeating six such cycles | Adhesion class 5 B Resistance value 6.1 mm Ω (No change between before and after the test) |

As is clear from the results shown in FIG. 2 (electromagnetic wave as measured in an advance test), more excellent shielding effect is available than in the 2 thick one-side electroless plating (Cu) film and in the 1 μm-thick two-sides electroless plating (Cu) shown in FIG. 3.

EXAMPLE 6

Under the same conditions as in the Example 4, an electromagnetic wave shielding plastic molding having similarly excellent properties was obtained by using an ABS (DIAPET 3001M) molding.

Figure 4:
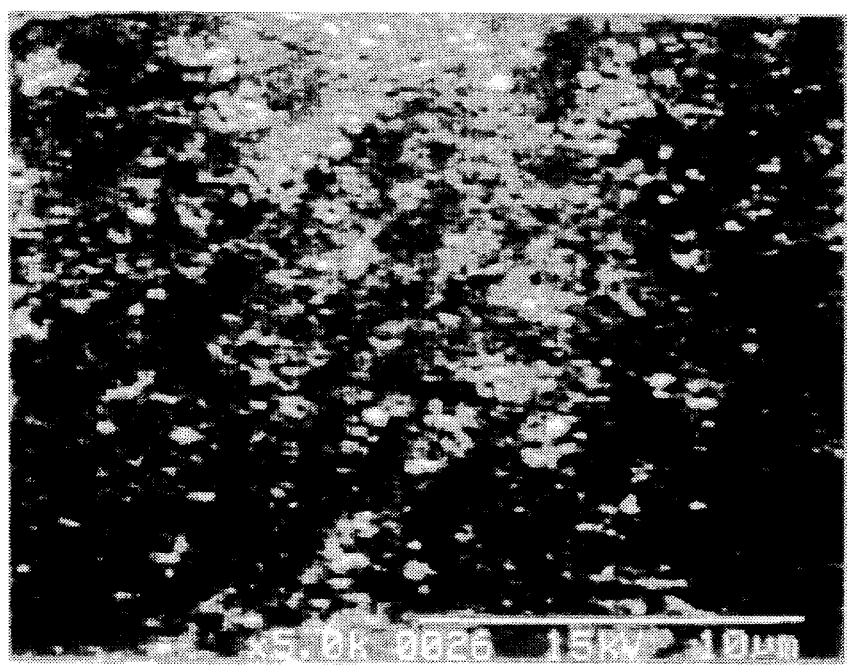
FIG. 4 is an electron micrograph illustrating the surface of an ABS molding after a plasma bombardment treatment.
Figure 5:
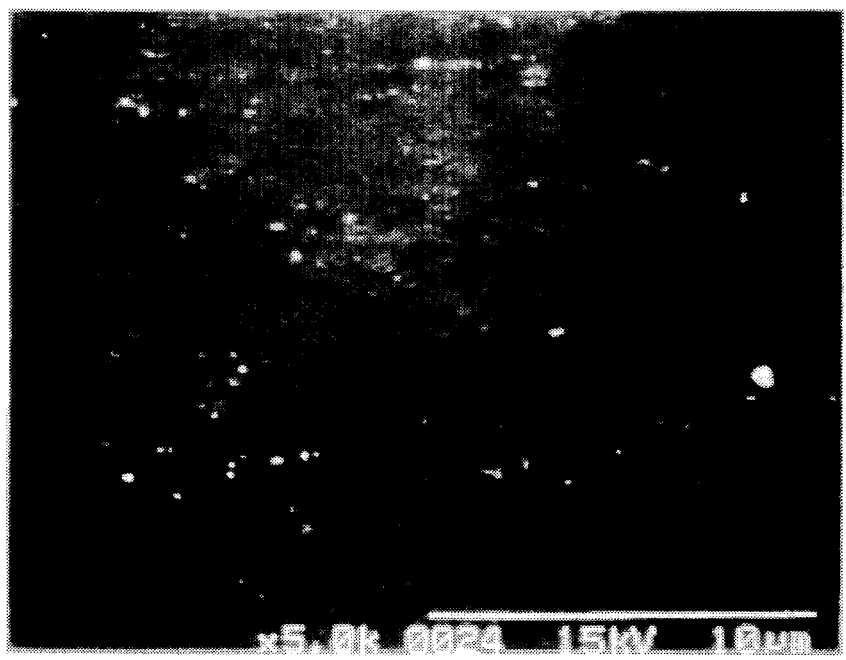
FIG. 5 is an electron micrograph illustrating the surface not bombard-treated.

The excel lent thin film adhering strength of this molding was evaluated in terms of the effect of surface bombardment brought about by high-frequency excited plasma. FIG. 4 is an electron micrograph illustrating a surface etched by bombardment, and FIG. 5,1 a non-bombard-treated surface.

As is clear from FIG. 4, the surface is etched by high-frequency excited plasma bombardment, and achievement of a high adhering strength was confirmed, by the anchor effect of the adhering thin film.

EXAMPLE 7

A copper film and a nickel-chromium film were formed directly by high-frequency excited plasma on a 150×150× 3.0 mm ABS sheet without FREON washing and without providing a primer coat layer.

More specifically, the ABS sheet was held for ten minutes for bombardment in glow plasma generated by coil-shaped high-frequency excitation (13.56 MHz) electrodes by bringing the reached degree of vacuum to $2\times10^{-5}$ Torr and introducing argon under a partial pressure of $1\times10^{-3}$ Torr, and then immediately a 0.6 μm-thick copper film under $1.5\times10^{-4}$ Torr.

Then, plasma was held for two minutes, and immediately, a 0.1 μm-thick nickel-chromium film (nickel/chromium=80/ 20) was formed.

The thus obtained electromagnetic shielding plastic molding had the following excellent properties as shown in Table 5.

Even after the environmental test, there was no peeloff in the interface between copper and nickel-chromium, nor decoloration on the surface of the nickel-chromium film.

From the results of measurement of electromagnetic wave in an advance test, a shielding effect almost equivalent to that in the case of the 1.3 μm-thick electroless plating (Cu) film was obtained.

TABLE 5

| Test item | Test method | Evaluation |
|---|---|---|
| Adhesion test | conformity to ASTMD 3359-78 | Class 5 B |

TABLE 5-continued

| Test item | Test method | Evaluation |
| --- | --- | --- |
| Humidity resistance | 65° C. × 95% RH × 240 hr | Adhesion class 5 B Resistance value 5.5 mm Ω |
| | (No change between before and after the test) | |
| Pencil hardness | Japan Industrial Standard K5401 | 3 H |
| Salt spray test | Japan Industrial Standard Z2371 | Adhesion class 5 B |
| | 5% NaCl, atmosphere 35° C. Sample angle: 45°, Spray for 8 hrs. stoppage for 16 hrs., Repeating six such cycles | Resistance value 5.6 mm Ω |
| | (No change between before and after the test) | |

EXAMPLE 8

A film was formed by high-frequency excited plasma (13.56 MHz) directly in a vacuum chamber on a 150×150 mm and 3 mm-thick injection molding sample comprising ABS/PC (50/50) resin, without FREON washing and without providing a primer coat layer.

With a reached degree of vacuum of $3\times10^{-5}$ Torr, argon was introduced so as to give $1\times10^{-3}$ Torr.

Plasma was held for ten minutes, and then immediately a 1.0 μm-thick copper film was formed under $1\times10^{-4}$ Torr. Plasma was further held for two minutes, and a 0.2 μm-thick nickel-chromium (nickel :chromium=50:50) film was formed under $1.5\times10^{-4}$ Torr.

In the same manner as in the Example 7, an electromagnetic wave shielding plastic molding having excellent properties was obtained.

EXAMPLE 9

Under the same conditions as in the Example 7, an ABS molding (DIAPET 3001M) was subjected to surface bombardment by high-frequency excited plasma, and then a copper film and a nickel-chromium film were formed. The surface was etched through high-frequency excited plasma bombardment, and achievement of a high adhering strength under the anchor effect of the adhering thin film was confirmed.

COMPARATIVE EXAMPLE 4

Under the same conditions as in the Example 7, alloy films having nickel-chromium ratio of 45:55 and 30:70 were formed. Microcracks were produced in an environmental test, thus revealing decrease in the shielding effect.

COMPARATIVE EXAMPLE 5

Under the same conditions as in the Example 7, SUS 301 and SUS 316 stainless steel films were formed in place of the nickel-chromium one. Because of the mixed iron, red-brown rust occurred in an environmental test.

COMPARATIVE EXAMPLE 6

Under the same conditions as in the Example 7, a nickel film was formed in place of the nickel-chromium one. Peeloff was produced on the interface between nickel and copper after an environmental test, and the nickel surface was discolored.

As is evident from the Examples 7 to 9, there is available, according to the present invention, an electromagnetic wave shielding plastic molding which is excellent in the electromagnetic wave shielding effects, while displaying favorable features of a gas-phase deposited film, permits savings in resources, has a high film adhering strength, is free from production of decoloration or rustle, does not require FREON washing nor provision of a primer coat layer, and eliminates the fear of contamination by waste liquid or waste gases.

EXAMPLE 10

A copper film and a nickel film were formed directly by high-frequency excited plasma on a 150×150×3.0 mm ABS sheet without FREON washing and without providing a primer coat layer.

More particularly, under a vacuum of $3\times10^{-5}$ Torr, argon was introduced under a partial pressure of $1\times10^{-3}$ Torr, in the same vacuum chamber. Glow plasma produced by coil-shaped high-frequency excitation (13.56 MHz) electrodes was held for ten minutes, and then immediately, a 0.6 μm-thick copper film was formed under $1\times10^{-4}$ Torr.

Then, the film was held in plasma for two minutes, and immediately, a 0.2 μm-thick tin film was formed in an ethylene atmosphere of $1.5\times10^{-4}$ Torr.

The thus obtained electromagnetic wave shielding plastic molding had excellent properties as shown in Table 6.

The obtained plastic molding in the shape of a 100×100×1 mm sheet was placed on an iron plate, and a 1-pound steel ball was dropped from above at a distance of 1 m wherein the production of cracks was observed on the film.

On a film formed without introduction of ethylene, the production of many cracks was observed as a result of a similar test.

The results of measurement of electromagnetic wave in an advance test showed a shielding effect on almost the same level as in the 1.3 μm-thick electroless plating (Cu) film.

TABLE 6

| Test item | Test method | Evaluation |
| --- | --- | --- |
| Adhesion test | conformity to ASTMD 3359-78 | Class 5 B |
| Humidity resistance | 65° C. × 95% RH × 240 hr | Adhesion class 5 B Resistance value 5.4 mm Ω |
| | (No change between before and after the test) | |
| Pencil hardness | Japan Industrial Standard K5401 | 3 H |
| Salt spray test | Japan Industrial Standard Z2371 | Adhesion class 5 B |
| | 5% NaCl, atmosphere 35° C. Sample angle: 45°, Spray for 8 hrs. stoppage for 16 hrs., Repeating six such cycles | Resistance value 5.5 mm Ω |
| | (No change between before and after the test) | |

EXAMPLE 11

A film was formed by high-frequency excited plasma (13.56 MHz) directly in a vacuum chamber on a 150×150 and 3 mm-thick injection molding sample comprising an ABS/PC (50/50) resin, without FREON washing and without providing a primer coat layer.

With a reached degree of vacuum of $3\times10^{-5}$ Torr, argon was introduced to give $1\times10^{-4}$ Torr.

Immediately after holding it in a plasma for ten minutes, a 1.0 μm-thick copper film was formed under $1 \times 10^{-4}$ Torr. After holding for further two minutes, a 0.2 m-thick nickel-chromium alloy film at a ratio of Ni to Cr of 60:40 was formed in ethylene atmosphere under $1.5 \times 10^{-4}$ Torr.

In the same manner as in the Example 12, an electromagnetic wave shielding plastic molding having excellent properties was obtained.

An electromagnetic wave shielding plastic molding is implemented, which is excellent in electromagnetic shielding effect, has a high adhering strength, is excellent in corrosion resistance and heat shock resistance, and is satisfactory both in strength and flexibility.

EXAMPLE 12

A copper film and an $SnO_2$ film were formed by high-frequency excited plasma on the inner bottom surface of an ABS container molding having inside dimensions of 50×50× 501, without FREON washing and without providing a primer coat layer.

More particularly, in the same vacuum chamber, the reached degree of vacuum was brought to $3 \times 10^{-5}$ Torr, and argon was introduced under a partial pressure of $1 \times 10^{-3}$ Torr. Immediately after holding it for ten minutes in glow plasma generated by coil-shaped high-frequency excitation (13.56 MHz) electrodes, a 1 μm-thick copper film was formed under $1 \times 10^{-4}$ Torr.

Then, after holding plasma for two minutes, a 0.5 μm-thick ITO film was formed under an oxygen partial pressure of $1.2 \times 10^{-4}$ Torr.

The thus obtained electromagnetic wave shielding plastic molding had excellent properties as shown in Table 7.

The $SnO_2$ film showed a good adhesion with a uniform thickness.

TABLE 7

| Test item | Test method | Evaluation |
|---|---|---|
| Adhesion test | conformity to ASTMD 3359-78 | Class 5 B |
| Humidity resistance | 65° C. × 95% RH × 240 hr | Adhesion class 5 B Resistance value 5.5 mm Ω |
| | (No change between before and after the test) | |
| Pencil hardness | Japan Industrial Standard K5401 | 3 H |
| Salt spray test | Japan Industrial Standard Z2371 | Adhesion class 5 B |
| | 5% NaCl, atmosphere 35° C. Sample angle: 45°, Spray for 8 hrs. stoppage for 16 hrs., Repeating six such cycles | Resistance value 5.8 mm Ω |
| | (No change between before and after the test) | |

From the result of measurement of electromagnetic wave in an advance test, availability of the same shielding effect as in the 1.3 μm-thick electroless plating (Cu) was confirmed. Even with the thin thickness of $SnO_2$ film of 0.2 μm, the effect was satisfactory, thus contributing to a saving of resources.

EXAMPLE 13

A film was formed by high-frequency excited plasma (13,56 MHz) directly in a vacuum chamber on a 150×150 and 3 mm-thick injection molding sample comprising an ABS/PC (50/50) resin, without FREON washing and without providing a primer coat layer.

The vacuum was brought to $3 \times 10^{-5}$ Torr, and argon was introduced so as to achieve $1 \times 10^{-3}$ Torr.

Immediately after holding it in the plasma for ten minutes, a 1.0 μm-thick copper film was formed under $1 \times 10^{-4}$ Torr. Then, after holding plasma further for two minutes, a 0.2 μm-thick ITO film was formed under an oxygen partial pressure of $1.5 \times 10^{-4}$ Torr.

As in the Example 12, an electromagnetic wave shielding plastic molding having excellent properties was obtained.

COMPARATIVE EXAMPLE 7

Under the same conditions as in the Example 12, a 0.2 μm-thick nickel (Ni) film was formed in place of ITO.

It was confirmed that yellowish decoloration occurred at the corners of the inside bottom surface after a salt spray test. This is attributable to the oxidation of copper.

EXAMPLE 14

A copper film was formed directly by high-frequency excited plasma on the housing of an automotive moving telephone formed from an ABS-PC alloy material as a plastic injection molding, without FREON washing and without providing a primer coat layer.

The reached degree of vacuum was brought to $5 \times 10^{-5}$ Torr, and argon was introduced under a partial pressure of $2 \times 10^{-4}$ Torr. By means of glow plasma generated by coil-shaped high-frequency excitation electrodes, copper vapor particles were excited and deposited onto the surface of the plastic injection molding. The film forming operation was continued until a copper film thickness of 1 μm was reached on the flat portion.

Then, an about 5 μm-thick copper film and an about 2 μm-thick nickel film were formed by electrolytic plating.

The thus obtained electromagnetic wave shielding plastic molding had very excellent properties as shown in Table 8.

TABLE 8

| Test item | Test method | Evaluation |
|---|---|---|
| Adhesion test | conformity to ASTMD 3359-78 | Class 5 B |
| Humidity resistance | 65° C. × 95% RH × 240 hr | Adhesion class 5 B Resistance value 5.5 mm Ω |
| | (No change between before and after the test) | |
| Pencil hardness | Japan Industrial Standard K5401 | 3 H |
| Salt spray test | Japan Industrial Standard Z2371 | Adhesion class 5 B |
| | 5% NaCl, atmosphere 35° C. Sample angle: 45°, Spray for 8 hrs. stoppage for 16 hrs., Repeating six such cycles | Resistance value 6.0 mm Ω |
| | (No change between before and after the test) | |

EXAMPLE 15

A 1 μm-thick copper film was formed by high-frequency excited plasma, directly in a vacuum chamber, on a 200×300 mm and 3 mm-thick injection molding sample comprising an ABS resin, without FREON washing and without providing a primer coat layer.

Copper was vaporized by an electron beam. The vacuum was brought to $4 \times 10^{-5}$ Torr, with an argon partial pressure of $4 \times 10^{-4}$ Torr.

As in the Example 14, electrolytic plating was applied to a thickness of 5 μm, and an electromagnetic wave shielding plastic molding having excellent properties was obtained.

EXAMPLE 16

Under the same conditions as in the Example 14, a 3 μm-thick copper film was first formed, and then electrolytic copper plating was applied to a thickness of 10 μm.

The thus obtained product showed excellent properties. The results of property tests are shown in Table 9.

TABLE 9

| Test item | Test method | Evaluation |
| --- | --- | --- |
| Adhesion test | conformity to ASTMD 3359-78 | Class 5 B |
| Humidity resistance | 65° C. × 95% RH × 240 hr | Adhesion class 5 B Resistance value 5.7 mm Ω |
| | (No change between before and after the test) | |
| Pencil hardness | Japan Industrial Standard K5401 | 3 H |
| Salt spray test | Japan Industrial Standard Z2371 | Adhesion class 5 B |
| | 5% NaCl, atmosphere 35° C. Sample angle: 45°, Spray for 8 hrs. stoppage for 16 hrs., Repeating six such cycles | Resistance value 6.1 mm Ω |
| | (No change between before and after the test) | |

EXAMPLE 17

A case inner molding for a lap-top personal computer was formed with a molding material comprising a chemical composition of polycarbonate (PC)/ABS resin=70/30 and containing 10 wt. % glass fiber. A water-soluble paint comprising an acrylic emulsion paint was applied, and the product was dried by hot blast for 60 minutes at a temperature of 85° C. A 1.5 μm-thick primer coat layer was thus formed.

In a vacuum deposition chamber, the vacuum was brought to $3 \times 10^{-5}$ Torr, and argon was introduced under a partial pressure of $1 \times 10^{-4}$ Torr. Immediately after holding for five minutes in glow plasma generated by coil-shaped high-frequency excitation (13.55 MHz) electrodes, a 2.0 μm-thick aluminum film was formed under an argon partial pressure of $2 \times 10^{-4}$ Torr.

Even after immersing the product in water at 60° C. for 24 hours, no deterioration occurred in the exterior view, adhesion and resistance value of the aluminum film.

The film was excellent in adhering strength, corrosion resistance, water resistance, and heat shock resistance.

The results of measurement of electromagnetic waves in an advance test revealed the availability of the same shielding effect as in the electroless plated (Cu) 1.3 μm-thick film.

EXAMPLE 18

An acrylic emulsion paint was applied onto a shielding plate of a portable telephone formed with a polycarbonate (PC) molding material containing 8 wt. % blended carbon fiber, and after hot blast drying at 80° C. for 60 minutes, a 20 μm-thick primer coat layer was formed.

Then, in a vacuum chamber (vacuum: $3 \times 10^{-5}$ Torr), the product was held for six minutes in a high-frequency plasma (13.56 MHz) under an argon pressure of $7 \times 10^{-4}$ Torr, and a 1 μm-thick copper film was formed under an argon pressure of $2 \times 10^{-4}$ Torr. Immediately after that, a 0.2 μm-thick nickel film was formed.

Even after immersing the product in water at 60° C. for 24 hours, no deterioration was observed in the exterior view, adhesion and resistance value.

EXAMPLE 19

Under the same conditions as in the Example 18, plasma was held further for two minutes after forming the copper film, and a 0.2 μm-thick nickel-chromium alloy film (Ni:Cr= 60:40) was formed in a $1.5 \times 10^{-4}$ Torr ethylene gas atmosphere.

Even after immersing the product in water at 60° C. for 24 hours, no change was observed in the exterior view, adhesion and resistance value.

Shielding effects were excellent as in Examples 17 and 18.

COMPARATIVE EXAMPLE 10

Under the same conditions as in the Example 18, an organic solvent type primer coat was formed.

After immersing the product in water at 60° C. for 24 hours, production of local cracks was observed.

The shielding effects were poorer.

EXAMPLE 20

This Example was carried out under the same conditions as in the Example 2, previously washing before the bombard-treatment was employed.

Parts of the surface of plastic molding contacted by molding pins, incline pins and sliding cores ware washed by the mixture solvent of acetone: n-hexane (50:50).

A sliding oil adhered to the parts of the surface is completely removed by the washing-treatment.

The adhesion properties of the conductive layer to the parts of the surface above-mentioned was more excellent. Indeed, the ratio of sub-standard articles, from the view point of the adhesion of the conductive layer, decreases from 1% to 0.3%.

What is claimed is:

1. A method of manufacturing an electromagnetic wave shielding plastic molding, which comprises the step of providing a conductive layer comprising at least a metal selected from the group consisting of Al, Cu, Ni, Cr and Sn or an alloy thereof on the surface of a plastic molding by high-frequency excited plasma in a vacuum chamber at a pressure or not more than $1 \times 10^{-3}$ Torr by the application of voltage from a high-frequency source, said conductive layer being formed on the plastic molding without prior washing and without providing a primer layer.

2. A method of manufacturing an electromagnetic wave shielding plastic molding as claimed in claim 1, wherein said conductive layer comprises a single layer or multiple layers.

3. A method of manufacturing an electromagnetic wave shielding plastic molding as claimed in claim 1, wherein after bombardment by high-frequency excited plasma, the conductive layer is provided by high-frequency excited plasma.

4. A method of manufacturing an electromagnetic wave shielding plastic molding as claimed in claim 1, wherein, without prior washing and without providing a primer coat layer, an aluminum film having a thickness of from 0.7 to 5.0 μm is formed by high-frequency excited plasma on the surface of the plastic molding.

5. A method of manufacturing an electromagnetic wave shielding plastic molding as claimed in claim 1, wherein, without prior washing and without providing a primer coat layer, a copper film having a thickness of from 0.7 to 5.0 μm and an aluminum film are formed by high-frequency excited plasma on the surface of the plastic molding.

6. A method of manufacturing an electromagnetic wave shielding plastic molding as claimed in claim 1 wherein, without prior washing and without providing a primer coat layer, a copper film having a thickness of 0.7 to 5.0 μm is formed in advance by high-frequency excited plasma in the same vacuum chamber on the surface of the plastic molding, and then a tin film having a thickness of from 0.05 to 2.0 μm is formed by high-frequency excited plasma.

7. A method of manufacturing an electromagnetic wave shielding plastic molding as claimed in claim 1 wherein, without prior washing and without providing a primer coat layer, a copper film having a thickness of from 0.7 to 5.0 μm is formed in advance by high-frequency excited plasma in the same vacuum chamber on the surface of the plastic molding, and then a nickel-chromium film having a thickness of from 0.05 to 2.0 μm and a nickel/chromium ratio of 50–80:50–20 is formed by high-frequency excited plasma.

8. A method of manufacturing an electromagnetic wave shielding plastic molding as claimed in claim 1 wherein, without prior washing and without providing a primer coat layer, a copper film having a thickness of from 0.7 to 5.0 μm is formed in advance by high-frequency excited plasma in the same vacuum chamber on the surface of the plastic molding, and then a metal or alloy film having a thickness of from 0.05 to 2.0 μm is formed in an organic gas atmosphere by high-frequency excited plasma.

9. A method of manufacturing an electromagnetic wave shielding plastic molding as claimed in claim 1 wherein, without prior washing and without providing a primer coat layer, a copper film having a thickness of from 0.7 to 5.0 μm is formed in advance by high-frequency excited plasma in the same vacuum chamber on the surface of the plastic molding, and then a conductive oxide film having a thickness of from 0.05 to 2.0 μm is formed by high-frequency excited plasma.

10. A method of manufacturing an electromagnetic wave shielding plastic molding as claimed in claim 1 wherein, without prior washing and without providing a primer coat layer, a copper film having a thickness of from 0.7 to 5.0 μm is formed in advance by high-frequency excited plasma in the same vacuum chamber on the surface of the plastic molding, and then a copper electrolytic plating film having a thickness of from 10 to 30 μm is formed.

11. A method of manufacturing an electromagnetic wave shielding plastic molding as claimed in claim 10, wherein a protecting film is formed on said copper electrolytic plating film.

12. A method of manufacturing an electromagnetic wave shielding plastic molding, which comprises the steps of providing a primer coat layer comprising a water-soluble paint on the surface of a plastic molding containing a filler, and after drying, providing a conductive layer comprising at least a metal selected from the group consisting of Al, Cu, Ni, Cr and Sn and alloys thereof by high-frequency excited plasma in a vacuum chamber at a pressure of not more than $1 \times 10^{-3}$ Torr by the application of voltage from a high-frequency source.

13. A method of manufacturing an electromagnetic wave shielding plastic molding as claimed in claim 12, wherein said conductive layer comprises a single layer or multiple films.

14. A method of manufacturing an electromagnetic wave shielding plastic molding as claimed in claim 12, wherein a primer coat layer comprising a water-soluble paint and having a thickness of from 1 to 30 μm is formed on the surface of the plastic molding containing a filler, and after low-temperature drying at a temperature of up to 100° C. an aluminum film having a thickness of from 0.6 to 5.0 μm is formed by high-frequency excited plasma in said vacuum chamber.

15. A method of manufacturing an electromagnetic wave shielding plastic molding as claimed in claim 14 wherein, a primer coat layer comprising a water-soluble paint and having a thickness of from 1 to 30 μm is formed on the surface of the plastic molding containing a filler, then after low-temperature drying at a temperature of up to 100° C., a copper film having a thickness of from 0.7 to 5.0 μm is formed in advance by high-frequency excited plasma in the vacuum chamber at a pressure of not more than $1 \times 10^{-3}$ Torr, and a corrosion-resistant metal or alloy film having a thickness of from 0.05 to 3.0 μm is further formed.

16. A method of manufacturing an electromagnetic wave shielding plastic molding as claimed in claim 15, wherein said corrosion-resistant metal or alloy film is formed in an organic gas atmosphere.

17. A method of manufacturing an electromagnetic wave shielding plastic molding, which comprises the steps of previously washing parts of surface of a plastic molding, which are contacted by molding pins or sliding cores adhering a sliding oil at the surface thereof, using an organic solvent or organic solvents, followed by bombard-treating the surface of plastic molding with high-frequency plasma, and then providing a conductive layer comprising at least one selected from the group consisting of Al, Cu, Ni, Cr and Sn and alloys thereof by high-frequency excited plasma on the surface of a plastic molding at a pressure of not more than $1 \times 10^{-3}$ Torr by the application of voltage from a high-frequency source.

18. A method as claimed in claim 17, wherein the organic solvent has a low boiling points.

19. A method as claimed in claim 18, wherein the organic solvent is selected from the group of ethanol, n-hexane and diethyl ether.

* * * * *